US009108221B2

(12) United States Patent
Galluzzo et al.

(10) Patent No.: US 9,108,221 B2
(45) Date of Patent: Aug. 18, 2015

(54) DUAL-FREQUENCY ULTRASOUND TRANSDUCER

(75) Inventors: Paul Mark Galluzzo, Cambridgeshire (GB); Justin Rorke Buckland, Cambridgeshire (GB); Neil Pollock, Royston Hertfordshire (GB)

(73) Assignee: SONOVIA HOLDINGS LLC, TOPEKA, KS (US)

( * ) Notice: Subject to any disclaimer, the term of this patent is extended or adjusted under 35 U.S.C. 154(b) by 730 days.

(21) Appl. No.: 13/379,063

(22) PCT Filed: Jun. 17, 2010

(86) PCT No.: PCT/EP2010/058582

§ 371 (c)(1), (2), (4) Date: Jul. 10, 2012

(87) PCT Pub. No.: WO2010/146136

PCT Pub. Date: Dec. 23, 2010

(65) Prior Publication Data

US 2012/0267986 A1 Oct. 25, 2012

(30) Foreign Application Priority Data

Jun. 19, 2009 (EP) .................................... 09163303

(51) Int. Cl.
*H01L 41/08* (2006.01)
*B06B 1/06* (2006.01)

(52) U.S. Cl.
CPC ......... *B06B 1/0603* (2013.01); *Y10T 29/49005* (2015.01)

(58) Field of Classification Search
USPC ......... 310/324, 326, 327, 340, 348, 352–354, 310/367, 369, 320–322, 330–332
See application file for complete search history.

(56) References Cited

U.S. PATENT DOCUMENTS 3,549,236 A * 12/1970 Mink ............................ 359/247
4,430,529 A * 2/1984 Nakagawa et al. ........... 381/190
(Continued)

FOREIGN PATENT DOCUMENTS

CA EP-2 194 664 A1 * 5/2010 ................ G06F 3/01
DE 195 27 018 C1 2/1997
(Continued)

OTHER PUBLICATIONS

European Search Report dated Dec. 9, 2009 received for priority European Patent Application 09163303.2 (7 pgs).
(Continued)

*Primary Examiner* — Thomas Dougherty
(74) *Attorney, Agent, or Firm* — Stinson Leonard Street LLP

(57) ABSTRACT

A dual-frequency ultrasound transducer, comprising a piezo-electric element bonded to a substrate, has two resonant vibration modes: a low frequency mechanical bending resonance mode and a relatively high frequency thickness resonance mode. The low frequency bending resonance mode occurs when the piezo-electric element is excited, in use, by a voltage which includes a low frequency oscillating component. The high frequency thickness resonance mode occurs when the piezo-electric element is excited, in use, by a voltage which includes a relatively high frequency oscillating component. The transducer may include a mounting arrangement, such as a support ring securing the periphery of the substrate to an underlying base layer that enhances the depth of penetration and focus of the ultrasound.

24 Claims, 9 Drawing Sheets

(56) References Cited

U.S. PATENT DOCUMENTS

| | | | | |
|---|---|---|---|---|
| 4,525,647 | A * | 6/1985 | Dworsky | 310/361 |
| 4,545,561 | A * | 10/1985 | Brown | 251/129.08 |
| 4,556,814 | A * | 12/1985 | Ito et al. | 310/334 |
| 4,779,246 | A * | 10/1988 | Dietzsch et al. | 367/157 |
| 4,963,782 | A | 10/1990 | Bui et al. | |
| 5,889,873 | A * | 3/1999 | Sasaki | 381/190 |
| 6,025,670 | A | 2/2000 | Corl et al. | |
| 6,234,990 | B1 | 5/2001 | Rowe et al. | |
| 6,472,797 | B1 * | 10/2002 | Kishimoto | 310/324 |
| 6,673,016 | B1 | 1/2004 | Bolorforosh et al. | |
| 7,273,457 | B2 | 9/2007 | Penner | |
| 2002/0156379 | A1 | 10/2002 | Angelsen et al. | |
| 2004/0171980 | A1 | 9/2004 | Mitragotri et al. | |
| 2005/0200241 | A1 | 9/2005 | Degertekin | |
| 2006/0235300 | A1 * | 10/2006 | Weng et al. | 600/439 |
| 2008/0021510 | A1 * | 1/2008 | Mi et al. | 607/36 |
| 2008/0225376 | A1 * | 9/2008 | Kim | 359/287 |
| 2009/0085441 | A1 | 4/2009 | Morris et al. | |
| 2009/0157358 | A1 * | 6/2009 | Kim | 702/185 |
| 2009/0236937 | A1 * | 9/2009 | Shiba | 310/322 |
| 2011/0071482 | A1 | 3/2011 | Selevan | |
| 2011/0178441 | A1 | 7/2011 | Tyler | |

FOREIGN PATENT DOCUMENTS

| | | |
|---|---|---|
| EP | 1 779 784 A1 | 5/2007 |
| JP | 2000233006 | 8/2000 |
| WO | WO 2005/087391 | 9/2005 |
| WO | WO 2007/013814 A | 2/2007 |

OTHER PUBLICATIONS

International Search Report and Opinion dated Aug. 12, 2010 received for priority PCT application PCT/EP2010/058582 (3 pgs).

* cited by examiner

DUAL-FREQUENCY ULTRASOUND TRANSDUCER

FIELD OF THE INVENTION

The invention relates to a transducer for emitting both low and high frequency ultrasound and to mounting arrangements for such a transducer that enable greater depth of penetration of the emitted ultrasound at the lower ultrasound frequency.

BACKGROUND TO THE INVENTION

Ultrasound applied to the skin has two main effects. First, cavitation results from the rapidly oscillating pressure field, causing bubble formation and collapse, which mechanically creates channels through the stratum corneum. The second effect is the direct heating of the material through which the sound waves are travelling, due to attenuation of the acoustic energy through reflection, absorption and dispersion. In skin, this occurs up to four times more than other tissues due to its heterogeneity. Heating is known to disrupt the lipid bilayer system in the stratum corneum also contributing to the enhanced permeability of the epidermis.

It is known that ultrasound can be used to deliver molecules to within the skin. When ultrasound is used in this context it is termed "sonophoresis". The permeability of the skin is increased by disruption of the intercellular lipids through heating and/or mechanical stress, and through the increase in porosity. Continuous mode ultrasound at an intensity of 1 W/cm$^2$ raises the temperature of tissue at a depth of 3 cm to around 40° C. in 10 minutes. For smaller molecules, such as mannitol, enhancement of permeation through the skin occurs when ultrasound is applied as a pre-treatment or simultaneously with application of the molecule; whereas for large molecules such as insulin, enhancement of permeation has only been recorded during application of ultrasound.

Cosmetic treatments that aim to improve skin quality are also hindered by the barrier function of the epidermis and in particular the outer stratum corneum. The epidermis provides a significant mechanical and chemical barrier to solute transfer due to the cornified cell/lipid bilayer. Also, there is significant enzymatic activity in the epidermis and dermis, which provides a biochemical defense to neutralise applied xenobiotics and which is comparable to that of the liver in terms of activity per unit volume. Additionally, the molecular weight of active substances is known to be important in determining their propensity to diffuse across the skin. Diffusion of substances of molecular weight around 500 Da and above is known to be inefficient. Methods and apparatus involving ultrasound have been described for use in cosmetic of the skin and in medical treatments.

To be effective, treatment for cosmetic skin conditions, such as skin ageing and sun damage, must deliver actives to at least the depth of the upper (papillary) dermis and therefore must employ a mechanism to overcome this effective physical and biochemical barrier, even when it has deteriorated with age.

Increasingly, low frequency ultrasound (e.g. <100 kHz) is being recognised[a] as more effective in enhancing transdermal drug/solute delivery (sonophoresis) due to its greater mechanical/non-thermal mode of cavitation and acoustic streaming. These mechanisms create temporary channels and force solutes through the otherwise impermeable stratum corneum of the skin. Higher frequencies do also have some benefits in solute delivery but this is largely attributed to more thermal effects whereby intercellular lipids are disrupted[b].

[a] Mitragotri et al, 1996, Transdermal drug delivery using low frequency sonophoresis, Pharm. Res., 13, 411-420.

[b] Lavon & Kost, 2004, Ultrasound and transdermal delivery, Drug Discovery Today, 9(15), August.

Higher frequencies, typically 1-3 MHz, have traditionally been employed for therapeutic effect such as in physiotherapy[c]. This is due to its ability to improve vascularity, protein expression and cytokine responses in cells. Most physiotherapy devices adopt frequencies in the high frequency range and can deliver either 1 MHz or 3 MHz or both (from separate transducer components). Frequencies above 3 MHz are rarely employed as only a small proportion of the acoustic energy will be delivered to target areas where physiotherapy would be needed such as muscles and ligaments. The ½ thickness values (depths at which respective frequencies decay to 50% of original intensity) for 1, 3 and 5 MHz are typically 9 cm, 2.5 cm and 1.25 cm through homogenous tissue respectively[d] indicating that only superficial soft tissue targets would benefit from frequencies of 3 MHz or above.

[c] Kitchen S S, Partridge C. J. A review of therapeutic ultrasound. *Physiotherapy.* 1990; 76:593-600

[d] Ultrasonic Biophysics, Gail ter Haar, Physical Principles of Medical Ultrasonics. Edited by C. R. Hill, J. C. Bamber and G. R. ter Haar.©2003 John Wiley & Sons, Ltd: ISBN 0 471 97002 6

Strict separation of application categories between low frequency (solute delivery) and high frequency (therapy) is not entirely appropriate as both frequency ranges have efficacy in both delivery and therapy[e]. However, it is recognised that the two frequency ranges interact with hard and soft tissue in predominantly different ways: i.e. low frequency—via mechanical/non-thermal effects; and high frequency—via thermal effects.

[e] Reher P.; Doan N.; Bradnock B.; Meghji S.; Harris M., Effect of ultrasound on the production of IL-8, basic FGF and VEGF, Cytokine, Volume 11, Number 6, June 1999, pp. 416-423(8)

For the treatment of dermal conditions, it is desirable to be able to exert both a therapeutic effect in the skin (e.g. increased vascularity and protein expression) and to enhance delivery of targeted actives into and through the skin. It is therefore logical that a dermatological ultrasound treatment would employ both frequency ranges to yield maximum efficacy, especially when used with a coupling gel that contains actives targeted at that specific condition.

Traditionally, therapeutic ultrasound devices that are capable of emitting more than one frequency have been limited to high frequencies, e.g. 1 and 3 MHz. The Chattanooga Intellect Legend Dual Frequency Ultrasound machine is an example. One device has been developed and marketed to emit both a low frequency and a high frequency; that being the SRA Developments 'Duoson' unit, which operates at 45 kHz and 1 MHz.

The Duoson device has spatially adjacent transducer elements comprising a centrally located circular high frequency transducer (1 MHz) and a low frequency (45 kHz) annular ring transducer encircling the central transducer. As with other therapeutic ultrasound devices, this dual frequency ultrasound device has a hand-held head/probe which requires constant manual manipulation/movement to treat areas of the body.

Constant movement of hand-held devices is important to avoid over and under exposure. Over-exposure can lead to over-heating/thermal damage and also standing waves being created with the potential to cause lysis of cells. Conversely, under-exposure will reduce the amount of ultrasonic energy received by a particular area of the body and therefore cause reduced therapeutic benefit.

Relying on manual movement of the device is unreliable and cannot guarantee even coverage and therefore exposure. Some areas will not receive the same level of treatment as others and are highly dependent on the abilities of the practitioner to keep the device moving at a constant steady speed, potentially over a 20-30 minute period. Such manipulation can lead to arm/wrist/hand fatigue and thus uneven treatment of the patient.

This would be an even greater problem if a device required emission of two frequency regimes and the two transducers were configured adjacently. In such a case, areas of skin and other underlying areas of the body might receive disproportionately more energy at one frequency than at another, if the device was not moved evenly over the area to be treated.

As shown in FIG. 1, WO2006/040597 generally discloses a treatment patch 100 that contains a plurality of transducer elements 110 arranged as an array and held in proximity to each other by compliant material 112, such as a silicone rubber layer. Each element 110 is individually connected to a power source via spring connectors 117 attached to juxtapositioned contacts 118 on a flexibly mounted plate 120. The transducer array may then be connected to an ultrasound generator via connectors 122. The transducer elements 110 can thus be driven by respective low and high frequency voltages in order to emit low and high frequency ultrasound.

Such an arrangement overcomes the aforementioned problems with hand-held devices, because if such a thin, flexible array is placed over a site to be treated then the area beneath the array will receive both high and low frequency ultrasound. If the activation of the transducers is also swept across the array, i.e. sequentially activating/deactivating rows, columns or other sub-groups of transducer elements, then the device will deliver a uniform treatment to the chosen area, overcoming problems with hot and cold spots (over and under exposure to the desired ultrasound). This will obviate operator error due to inconsistent movement of an otherwise hand-held device.

Moreover, each transducer element 110 may comprise two components: a high frequency transducer element, e.g. a piezo ceramic disc element 114 and a low frequency transducer element, e.g. a PVDF element 116. The upper surface of the piezo ceramic element 114 and the lower surface of the PVDF element 116 may be connected together electrically. FIG. 1*c* shows a particular form of the transducer element 110 in which the piezo ceramic disc 114 is conductively attached to a metal element 124 which in turn is conductively attached to the PVDF element 116 via a metal ring 126 and insulating spacer ring 128. A common voltage connection is achieved via a conductive ring 130. Alternate drive frequencies of 50 kHz and 1 MHz are generated either by individual circuits or via DDS chip, and the combined transducer 110 is alternatively energised in bursts of 50 kHz and 1 MHz sine wave pulses.

Such uniaxially mounted elements 114,116 allow multiple frequency emission along a common axis. This would obviously increase the number of components that need to be assembled, increase the weight of what is intended to be a lightweight flexible patch and also increase the thickness. Extra thickness, wiring and mounting of several transducers in this way would also adversely affect the radius of curvature that the patch could bend to, so minimising the different human or animal body sites to which the patch could conform.

SUMMARY OF THE INVENTION

According to a first aspect of the invention, there is provided a dual-frequency ultrasound transducer, comprising:

a substrate; and a piezo-electric element bonded to the substrate;

wherein the transducer has a low frequency mechanical bending resonance mode when the piezo-electric element is excited, in use, by a voltage which includes a low frequency oscillating component; and wherein the transducer has a relatively high frequency thickness resonance mode when the piezo-electric element is excited, in use, by a voltage which includes a relatively high frequency oscillating component.

Such a transducer overcomes the disadvantages noted above in connection with the prior art because it is capable of emitting both low and high frequency ultrasound from the single piezo-electric element. An additional manufacturing advantage is that an array of such transducers has the potential to be lighter, less bulky and cheaper to manufacture than if there needed to be groups of two different transducers each delivering a different frequency.

The piezo-electric element may be recessed in from the edge of the substrate.

The composite structure actually tends to curve backwards at the edges relative to the remainder of the structure if it is supported at those edges, i.e. when the structure is deflected into a generally concave shape, the edges adjacent to the support may take a convex shape, and vice versa. It is only desired for the piezo-electric element to extend over a portion of substrate that is all bending in the same direction (for example, all curved downwards, whereas the ends are curving upwards), so by recessing the piezo-electric element in from the edges counter curvature of the piezo-electric element is avoided.

The piezo-electric element may be a planar disc and/or the substrate may be a planar disc.

The transducer may further comprise a base layer on which the substrate is supported, the outer edge of the substrate being bent away and out of contact from the base layer.

This arrangement avoids the transmission of anti-phase zones of ultrasound into the acoustic medium.

The peripheral edge of the substrate may be clamped between a support structure and a base layer. The support structure may include an inward facing recess into which the peripheral edge of the substrate is received, such that the interface between the support structure and the substrate comprises a "quasi built-in" support. Alternatively, the support structure may include a pointed bottom surface, such that the interface between the support structure and the substrate comprises a "quasi pin joint".

These mounting arrangements allow for enhanced emission at the low frequency. Securing the periphery of the piezo-electric element will increase the amplitude of acoustic pressure generated at the low frequency and also enable deeper penetration of this frequency regime by increasing the effective width of vibrating substrate. The reason for the latter is that for a vibrating object whose width is significantly less than the acoustic wavelength at the frequency of vibration, the depth of penetration of the acoustic field is roughly proportional to the width of the vibrating object According to an alternative construction, the substrate may be profiled to form a recess in which the piezo-electric element is received. This is advantageous in that it dispenses with the need to have a separate support structure; the substrate itself becomes the support structure. Accordingly, a component and an associated assembly operation are eliminated, which would reduce the cost of the final product.

The substrate is preferably metal.

This delivers best performance at low frequency. If, however, it is desired instead to design for best performance at high frequency (and thus to compromise on low frequency performance), the substrate could be plastic, such as a glass filled PBT, or LCP.

According to a second aspect of the invention, there is provided a patch comprising a plurality of the above transducers arranged in an array.

According to a third aspect of the invention, there is provided a method of manufacturing a dual-frequency ultrasound transducer, comprising:

bonding a piezo-electric element to a substrate;

wherein the piezo-electric element and substrate are selected to have a combined thickness corresponding to odd numbers of half a desired high frequency resonant wavelength; and wherein the diameters of the piezo-electric element and the substrate are determined on the basis of the selected thicknesses and a desired low frequency resonant frequency.

By selecting the thicknesses which give the desired high frequency resonance, and then determining the diameters which give the desired low frequency resonance based on these thicknesses, it is possible to manufacture a transducer that is capable of emitting both high and low frequency ultrasound from just a single piezo-electric element.

The diameters may be determined as at least 5 times the combined thickness of the PZT and substrate.

The method may further comprise selecting the substrate material so as to maximise performance of the transducer at the desired low frequency resonant frequency.

It has been found that low frequency power output targets are more difficult to achieve than high frequency power output targets, so it is preferred to focus on the performance at the low frequency resonant frequency. To enhance the reaction force from the substrate layer in bending vibration at the low frequency without overly increasing the bending stiffness, it is preferable for the substrate to be metal. However, as stated above, the substrate could be selected to be plastic, such as a glass filled PBT, or LCP, to maximise performance at high frequency (and thus to compromise on low frequency performance).

The method may further comprise selecting the substrate and transducer materials and thicknesses according to the equation:

$$Y_1 h_1^2 = Y_2 h_2^2,$$

where $Y_1$ is the stiffness of the piezo-electric element, $Y_2$ is the stiffness of the substrate, $h_1$ is the thickness of the piezo-electric element and $h_2$ is the thickness of the substrate.

BRIEF DESCRIPTION OF THE DRAWINGS

The invention will be described, by way of example, with reference to the accompanying drawings, in which:

FIG. 1 illustrates a prior art ultrasound transducer patch.

DETAILED DESCRIPTION

The term "ultrasound" describes sound frequencies of 20 kHz and above, a low ultrasound frequency is herein defined as being from 20 to 500 kHz; a high ultrasound frequency is herein defined as being from 500 kHz (0.5 MHz) to 5 MHz.

Basic Construction

Figure 2:
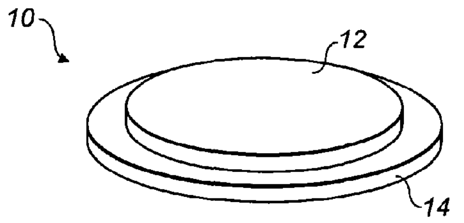
FIG. 2 is a schematic perspective view of a dual-frequency transducer according to one aspect of the invention.
Figure 3:
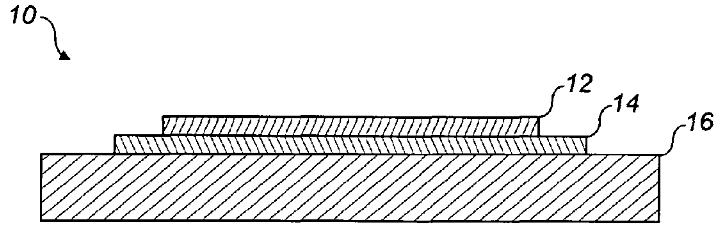
FIG. 3 is a schematic cross-section of the dual-frequency transducer of FIG. 2.

A dual-frequency ultrasound transducer 10 comprises a piezo-electric element 12, which is preferably formed from a piezoceramic material, such as PZT, and an underlying elastic substrate 14. The transducer is a "unimorph", in other words the piezo-electric element is bonded to the elastic substrate 14. The basic layout is illustrated in FIGS. 2 and 3. The piezo-electric element 12 and the elastic substrate 14 are each planar, disc-like elements. The piezo-electric element 12 is of a smaller diameter than the substrate 14, for a purpose to be described below.

The transducer 10 is designed to be placed upon an acoustic medium 16, in order to transmit acoustic energy from the transducer into the acoustic medium. In the context of this invention, the acoustic medium 16 may be the skin or flesh of a person using the device. Preferably, as described in WO2006/040597, a gel pad or other intermediary such as a free liquid medium may be positioned between the transducer 10 and the skin or flesh of the person using the device, in which case the acoustic medium 16 may represent that gel pad.

It is preferred for the transducer 10 to comprise part of an array of similar transducers in a treatment patch.

The transducer 10 is capable of vibrating in two distinct modes: a low frequency mechanical bending resonance mode; and a high frequency thickness-type oscillation resonance mode.

The low frequency and high frequency components of the ultrasound are preferably applied in pulsed mode.

Pulsed is preferred over continuous mode because not only does this minimise the risk of standing wave production in fluids, but this subjects cells and proteins to multiple step-change increases and decreases in acoustic energy that allows cyclical stimulation and relaxation which has been postulated to maximise biological/cellular responses and sonophoretic effects. Moreover, pulsed drive requires less power than continuous drive.

Low Frequency Vibration Resonance

Figure 4:
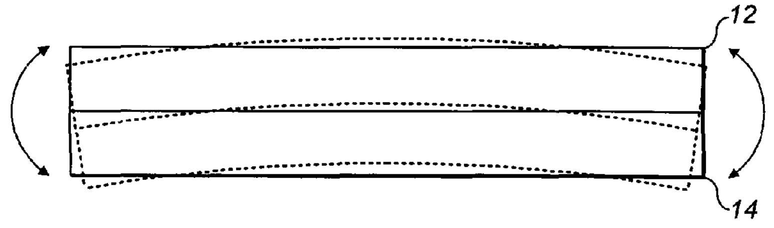
FIG. 4 illustrates, schematically and in cross section, a low frequency mechanical bending resonance mode of the transducer.

The low frequency mechanical bending resonance mode is achieved by applying a voltage which includes a low frequency oscillating component to the piezo-electric element 12. The resonant vibration behaviour for the low frequency resonance is depicted (not to scale) in FIG. 4, whereby the rectangular boxes represent the initial undisplaced shape of the transducer 10, and the dotted lines represent the shape of the structure when deflected from that initial position during vibration in the low frequency bending mode.

It will be seen that the bending mode thus comprises a displacement of the transducer 10 out of the plane of the undisplaced transducer, with a maxima at the centre of the transducer and with minimal displacement at a peripheral edge thereof.

High Frequency Vibration Resonance

Figure 5:
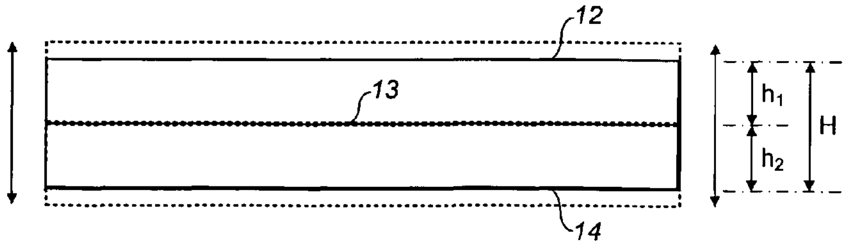
FIG. 5 illustrates, schematically and in cross section, a high frequency thickness resonance mode of the transducer.

The high frequency thickness-type oscillation resonance mode is achieved by applying a voltage which includes a high frequency oscillating component to the piezo-electric element 12. The resonant vibration behaviour for the high frequency resonance is depicted (not to scale) in FIG. 5, whereby the smaller rectangular boxes represent the initial undisplaced shape of the transducer 10, and the larger rectangular boxes, shown in dotted lines, represent the shape of the structure when deflected from that initial position during vibration in the high frequency thickness mode.

The thickness mode thus comprises a substantially uniform displacement of the piezo-electric element 12 across its width, the top and bottom surfaces of the piezo-electric element 12 remaining substantially parallel with each other and with their initial undisplaced plane.

For this thickness mode, the total transducer thickness H (as illustrated) may be thought of as a half-wavelength. This is because the top and bottom are essentially unconstrained and vibrating freely but out of phase. For this reason, the resonant frequency is predominantly determined by the thickness rather than the diameter, and the stiffnesses and densities of the two layers (i.e. the piezo-electric element 12 and the substrate 14) of the transducer 10.

Method of Design

The low frequency resonant frequency is determined by the diameters and thicknesses of the piezo-electric element 12 and the substrate 14 comprising the transducer 10. The high frequency resonant frequency is, however, determined only by the thicknesses of the transducer 10, assuming that the diameter is significantly greater than (say 5 times) the combined thickness of piezo-electric element 12 and substrate 14.

For this application a high frequency resonance of (for example) 3 MHz and a low frequency of (for example) 50 kHz are sought.

Therefore, the thicknesses of the piezo-electric element 12 and the substrate 14 which give the desired high frequency resonance are selected first, with the diameters which give the desired low frequency resonance based on these thicknesses then being determined.

Figure 6:
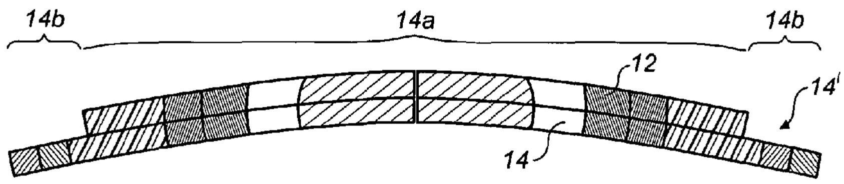
FIG. 6 illustrates a compound bend in the substrate.

As noted above, the diameters of the two layers of the transducer 10 are not identical, with the piezo-electric element 12 being recessed in from the edge of the substrate 14. This is because the composite structure actually tends to form a compound curve, curving back on itself at the peripheral edge 14' if it is supported at that edge, and it is preferred for the piezo-electric element 12 to extend over a portion 14*a* of the substrate 14 which is all bending in the same direction (for example, all curved downwards, whereas the ends 14*b* are curving upwards). This is illustrated in FIG. 6.

Basic Choice of Materials

There are two contrasting criteria for selecting the material for the substrate 14.

For the high frequency mode, the substrate 14 is ideally a material whose acoustic impedance is between that of the piezo-electric element 12 and the acoustic medium below (which in practice would be skin and flesh, but may be considered to have the same acoustic properties as water). This would lead to the best compromise for acoustically matching the components. For example, a stiff plastic would be typical for a high performance thickness mode device, and the substrate 14 would be referred to as a "quarter wavelength matching layer". Examples of such a stiff plastic include glass-filed PBT or LCP.

For the low frequency mode, the substrate 14 ideally gives good stiffness matching to the piezo-electric element 12 to optimise the amount of bending. A standard equation for selecting substrate thickness for bending mode devices, aimed at giving a balance between strong reaction force from the substrate 14 and low resistance to bending, is:

$$Y_1 h_1^2 = Y_2 h_2^2,$$

where $Y_1$ is the stiffness of the piezo-electric element 12, $Y_2$ is the stiffness of the substrate 14, $h_1$ is the thickness of the piezo-electric element 12 and $h_2$ is the thickness of the substrate 14. For the thicknesses in this application, a far superior performance is achieved in the low frequency (bending) mode if a metal substrate is used rather than a plastic substrate.

In other words, the high frequency mode is better served (i.e. a greater vibration amplitude is achieved) by selecting a plastic substrate 14, whereas the low frequency mode is better served (i.e. a greater vibration amplitude is achieved) by selecting a metal substrate 14 such as stainless steel. It is also believed that the power efficiency (acoustic power out/electrical power in) follows similarly.

Given target amplitudes of acoustic intensity based on the Duoson device (see 'Background to the Invention'), it was anticipated that it would be more difficult to achieve the low frequency power output target than the high frequency power output target. Accordingly, a design which helps with the low frequency performance, in other words a metal substrate, is preferable. In theory, the target acoustic intensities at the two frequencies are physiologically relevant, and hence the choice of a stainless steel substrate 14 will give good physiological performance.

An Alternative Thickness Design

It is mentioned above that the thicknesses of the piezo-electric element 12 and the substrate 14 are chosen such that the total thickness of the transducer 10 is akin to a "half wavelength". It will be appreciated that the transducer could instead be designed to resonate at the same frequency, but be "one wavelength thick", "one and a half wavelengths thick", "two wavelengths thick", or indeed "two and a half wavelengths thick" at the desired high frequency operating point. In other words, if the transducer 10 is made thicker, more room is made for one or more further nodal plane(s) in the transducer. As drawn in FIG. 5, there is only one nodal plane 13 and it is located approximately halfway through the total thickness H.

With a "one wavelength thick" transducer, there would be two such nodal planes. This would of course make the transducer 10 thicker. Recalling that the required diameters of the piezo-electric element 12 and the substrate 14 are determined after determining their combined thickness H, a thicker transducer would require correspondingly greater diameters. A "one wavelength thick" transducer would therefore be much wider (due to being thicker) than a "half wavelength thick" transducer. This alternative approach is therefore not preferable for this application, where compact transducers 10 are desired.

The "half wavelength thick" transducer 10 typically turns out at around 8 mm diameter, which is large enough not to have too many transducers to fill in a patch, but not so large that the patch ends up too discretised, which could lead to insufficient coverage (i.e. uneven application of ultrasound energy to the area underlying the patch).

Mounting the Dual-Frequency Transducers in a Treatment Patch

Figure 1A:
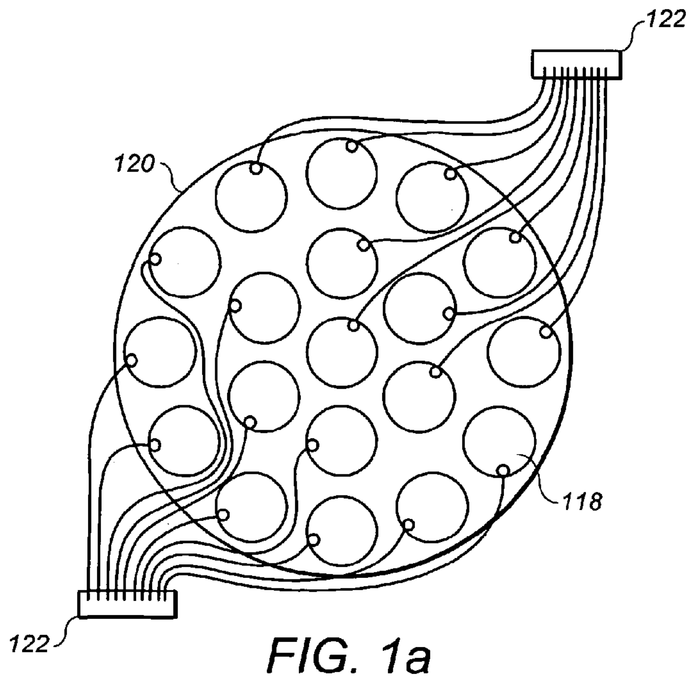
FIG. 1a PRIOR ART
FIG. 1*a* being a plan view of the patch, with an upper layer removed, showing contacts and electrical connections.
Figure 1B:
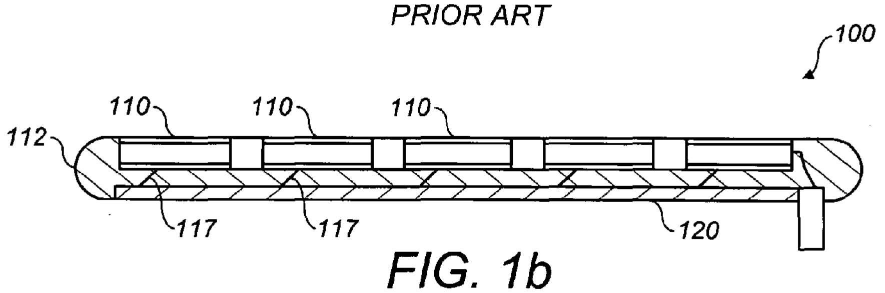
FIG. 1b PRIOR ART
FIG. 1*b* being a cross-section through the patch.
Figure 1C:
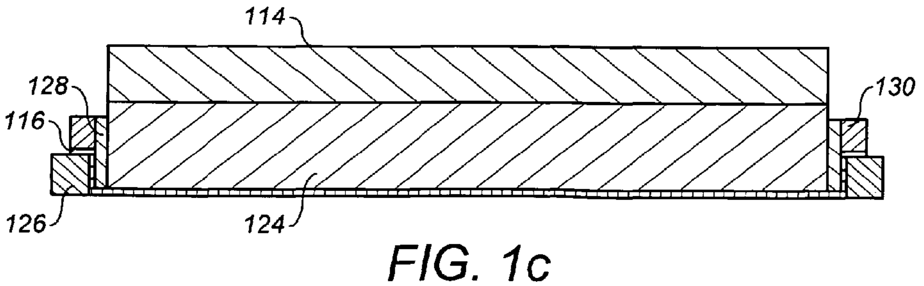
FIG. 1c PRIOR ART
FIG. 1*c* being a cross-section through an individual transducer element.
Figure 20:
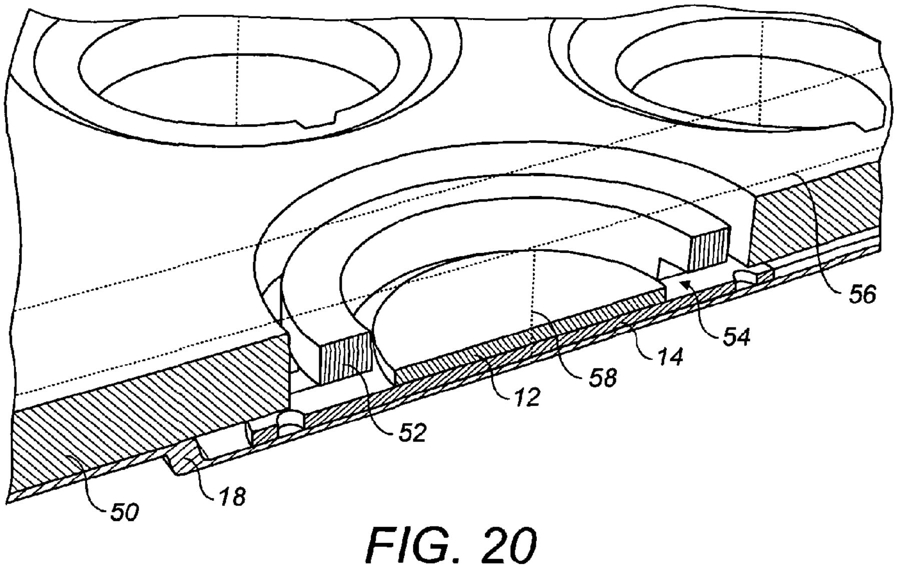
FIG. 20 is a perspective cross-sectional view of an array of transducers according to one aspect of the invention.

FIG. 20 illustrates a typical mounting arrangement for an array of dual-frequency transducers 10 in a treatment patch. The overall construction is similar to that of the prior art patch described above with reference to FIG. 1. The transducers 10 are arranged in an array and held in proximity to one another by a thin, compliant material 50, such as silicone rubber or foam. Each transducer 10 is bonded to a rigid metal ring 52 (which may be stainless steel) using a rigid adhesive 54 such as an epoxy or a cyano-acrylate. An insulating membrane 18 is adhered to the bottom surface of the transducer substrate 14 with a pressure-sensitive adhesive. It is important that there are no air bubbles between the membrane 18 and the substrate 14 as this will reduce the effective transfer of energy between the transducer and the acoustic medium 16 (e.g. skin).

Electrical connections to each of the transducers 10 are made by direct soldering of wires 56, 58 to both the piezo-electric element 12 and to the substrate 14. The insulating membrane provides electrical insulation.

Such a treatment patch could be used for cosmetic or medical dermatology (e.g. wound healing[f]). In addition, other areas that could benefit from this outside of those two main areas are:

[f] Dyson, M and Smalley, D: Effects of ultrasound on wound contraction. In Millner, R and Corket, U (eds): Ultrasound Interactions in Biology and Medicine. Plenum, New York, 1983, p 151.

1. Transdermal drug delivery
2. Physiotherapy
3. Bone healing[g]

[g] Li J. K.; Chang W. H. 1; Lin J. C.; Ruaan R. C.; Liu H. C.; Sun J. S., Cytokine release from osteoblasts in response to ultrasound stimulation, *Biomaterials*, Volume 24, Number 13, June 2003, pp. 2379-2385(7)

No significant modifications would be required as there would only require a different weighting of the two frequencies and therefore relative increases in the signal strength, duty cycle and pulse length for that frequency. Bone healing would most significantly benefit from low frequency transmission through outer-lying soft tissue and physiotherapy would benefit from both frequency ranges due to the depth of penetration of low frequency and the warming effect of the higher frequency. Transdermal drug delivery would benefit equally from the two frequency ranges as both high and low would temporarily increase permeability of the outer epidermis and stratum corneum particularly.

In the cases of medical dermatology, transdermal drug delivery, physiotherapy and bone healing the technology would be equally applicable to all relevant veterinarian applications.

Depending on the depth of penetration of ultrasound and delivered actives that are needed, different intensities and cumulative time exposure can be varied in each of the low and high frequency regimes. For example, deeper treatment of cellulite, physiotherapy and bone healing would benefit from a greater relative exposure of lower frequency ultrasound. Shallower target conditions such as anti-ageing, acne, scar prevention and reduction would benefit from a greater proportion of higher frequency exposure.

Depth of Penetration

The amount of pressure generated immediately beneath the transducer 10 is different for the low and high frequencies. At the high frequency, the transducer produces "beam-like" behaviour because the width of vibration is much larger than the acoustic wavelength in water at that frequency, and the acoustic medium (flesh) is considered to behave like water. At the low frequency, the transducer 10 is much smaller than a wavelength in width, and the acoustic field is dominated by an inertial effect near the transducer, whereby a mass of material (e.g. water) is accelerated and decelerated by the transducer oscillation and produces a local pressure field determined by "F=m a". The size of this local pressure and velocity field for the low frequency is critical for the device, because the field must penetrate into the skin of the person using the device.

For reference, the acoustic wavelength A of water is given by:

$$\lambda = c/f$$

where c is the speed of sound (1500 m/s in water) and f is the frequency (e.g. 50 kHz and 3 MHz). With a transducer diameter of around 8 mm, for example, the transducer is much wider than the wavelength 0.5 mm at 3 MHz, and much narrower than the wavelength 30 mm at 50 kHz.

The amount of pressure p generated at the low frequency, where the transducer 10 is much smaller than a wavelength, is determined by the following equation:

$$p = 0.5\,\rho L\,V\omega$$

where ρ is the density of the acoustic medium (water), L is the length scale of the oscillating surface in contact with the water, V is the amplitude of velocity oscillation of the transducer 10, and ω is the frequency of oscillation in rad/s. The length scale L is critical here.

Key points regarding the length scale L are as follows:

1. The length scale L is a simple multiple of the effective width of vibration of the transducer surface. Thus, changing the diameters of the transducer components is a method of influencing L.
2. The pressure generated is proportional to L, through the above equation. Thus, to get greater acoustic intensity, L should be maximised.
3. The depth of the pressure field beneath the transducer 10 is directly proportional to L, typically roughly equal to L. Thus, L should also be maximised to get greater penetration depth.

Point 3 in this list is particularly important, as the depth of penetration of the ultrasound should reach the depth in the dermis or epidermis where ultrasonic intensity is desired. The following text is concerned entirely with the low frequency behaviour, and solutions for enhancing the depth of penetration at the low frequency by increasing this length scale L.

Mounting Arrangements

Figure 7:
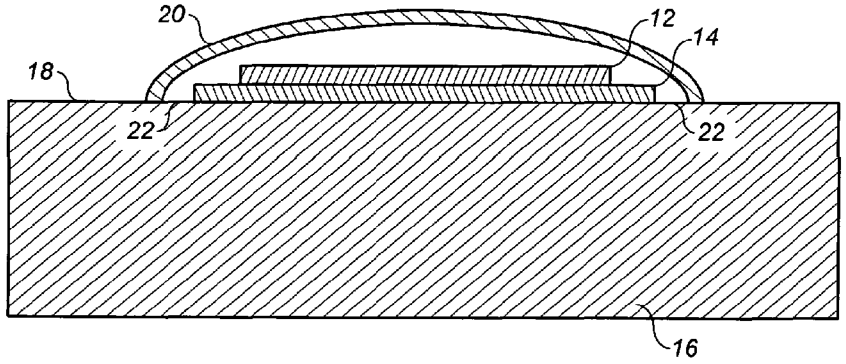
FIG. 7 is a schematic cross-sectional view of a capped transducer according to one aspect of the invention in situ above an acoustic medium.
Figure 8:
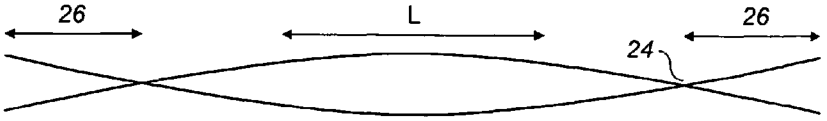
FIG. 8 shows the vibration profile of the mounting arrangement of FIG. 7.

A basic method of mounting a transducer 10 is shown schematically in FIG. 7. The transducer 10, comprising the piezo-electric element 12 and the substrate 14, is mounted on a base layer or membrane 18. The membrane 18 is thin and flexible, to minimise any dissipation of energy and hence reductions in the amplitude of the transducer 10. A cap 20 is mounted to the membrane 18 and extends over the transducer 10 to protect the piezo-electric element 12 and the substrate 14. There is webbing 22 between the edge of the transducer (i.e. the peripheral edge 14' of the substrate 14) and the cap 20. This effectively creates a "free support" boundary condition for the transducer 10, i.e. the transducer's vibration profile at the low frequency is close to what it would be if suspended in free space. This vibration profile is shown in FIG. 8.

Note that the effective in-phase width L of the transducer 10 is restricted to a fraction of the nodal diameter (the distance between the opposite nodes 24), and that the effective width L is also reduced by the presence of out of phase regions 26 on the transducer 10.

Figure 9:
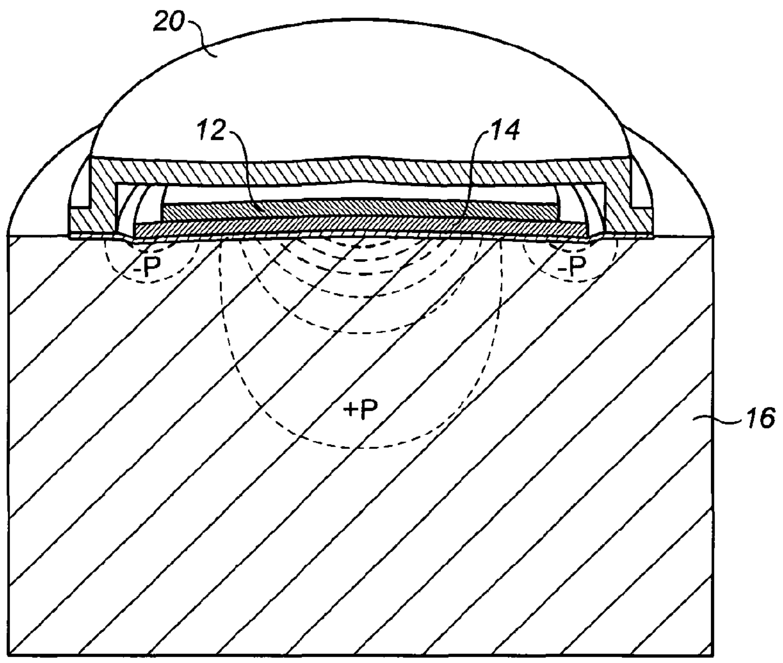
FIG. 9 is a cut-away view of an axi-symmetric finite element model simulation of the mounting arrangement of FIG. 7 showing the pressure field, with the transducer displaced slightly according to its vibration profile.
Figure 10:
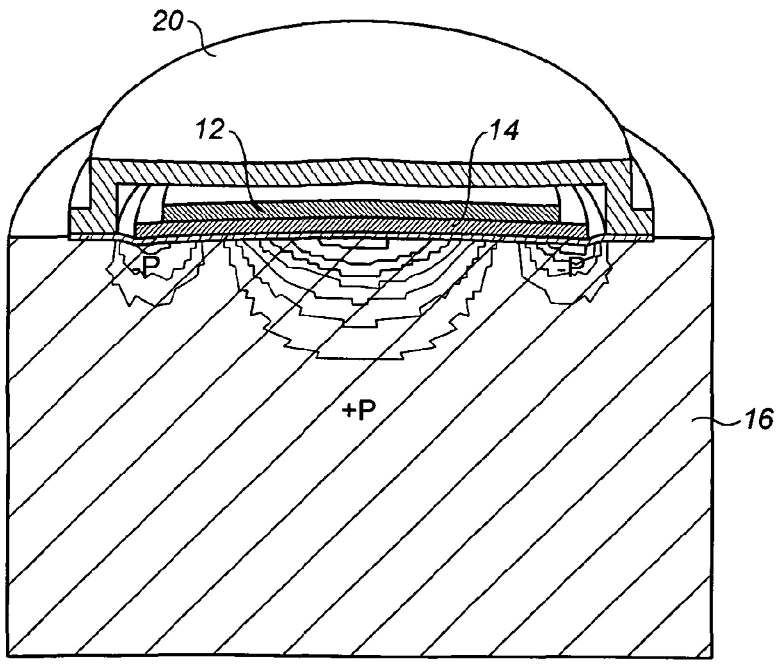
FIG. 10 corresponds to FIG. 9, but showing the velocity field.

A physical representation of this mounting was modelled in a finite element simulation model. The pressure and velocity fields are shown in FIGS. 9 and 10, respectively. The plots show cut-away views of an axi-symmetric simulation, with the transducer 10 displaced slightly according to its vibration profile. The cap 20 is modelled as a rectangular plastic cap. The acoustic medium 16 is modelled as water. The pressure field shows the pressure at 0 deg phase, rather than the amplitude, to illustrate that the pressure at the centre is out of phase with the pressure at the edges.

In these simulations, the value of L may be calculated as roughly 2.5 mm, and the effective depth of penetration is around 2 mm. Clearly, it is desirable to increase the depth of penetration of this low frequency ultrasound to a larger depth.

Potential Techniques for Increasing L, and Hence Increasing Penetration Depth

Figure 11:
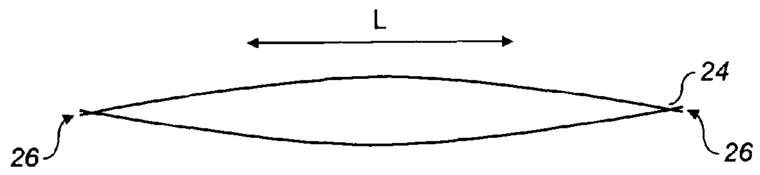
FIG. 11 shows the vibration profile of an alternative mounting arrangement in which the substrate is supported by a "pin type" joint.
Figure 12:
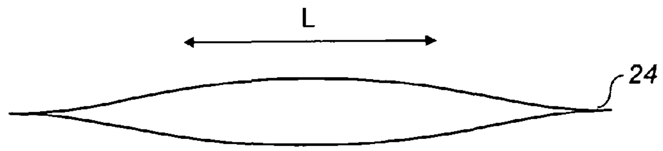
FIG. 12 shows the vibration profile of another alternative mounting arrangement in which the substrate is supported by a "built-in" type joint.
Figure 13:
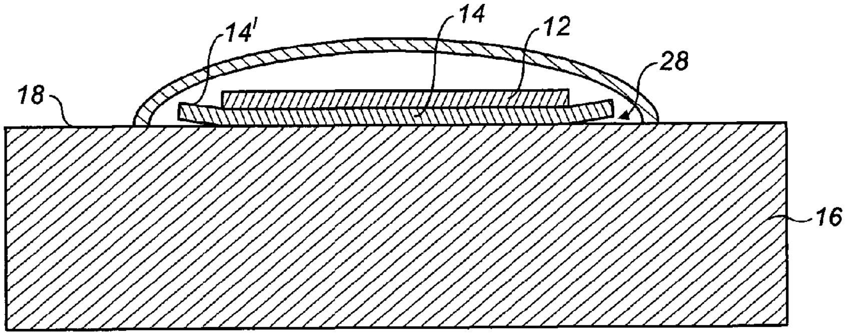
FIG. 13 illustrates yet another alternative mounting arrangement, in which the outer edge of the substrate is lifted from an underlying base layer.

Based on the preceding discussion, example methods for increasing the depth of penetration include the following:

- Change the supports to the transducer 10 such that the transducer is no longer effectively "freely supported". For example with a "pin joint" like contact, displacement is constrained but rotation is freely allowed, and the transducer's first and only nodal diameter is at the outer edge of the transducer 10, by virtue of the nodes 24 being at the "pin joint". See FIG. 11.
- Change the supports to the transducer 10 to act like "built-in" supports, i.e. displacement and rotation are both prevented at the edge. With "built-in" supports, the displacement and rotation are both constrained at the outer edge. See FIG. 12.
- Keep a "freely supported" type of mount, but taking the out of phase regions out of contact with the acoustic medium 16. This avoids the transmission of anti-phase zones of ultrasound into the acoustic medium 16. This can be achieved by bending the peripheral edge 14' of the substrate 14 away and out of contact from the membrane 18, defining a small air gap 28 between the peripheral edge and the membrane. See FIG. 13.

With a "quasi pin joint" like contact, the out of phase portions 26 of motion are essentially eliminated, and the nodal diameter is enlarged. Both of these factors cause an increase in L. An up-side of this approach compared with "built-in" supports is that the displacement profile is larger out to a larger fraction of the nodal diameter, but a down-side is that it tends to push the resonant frequency down, necessitating a smaller device for a given resonant frequency. Since a smaller device gives lower values of L, this defeats some of the benefit.

Compared to a "pin joint" support, a "built-in" support restricts the transducer motion (i.e. amplitude of displacement) adequately and keeps the frequency large and thus avoids the need to shrink the device.

Figure 14:
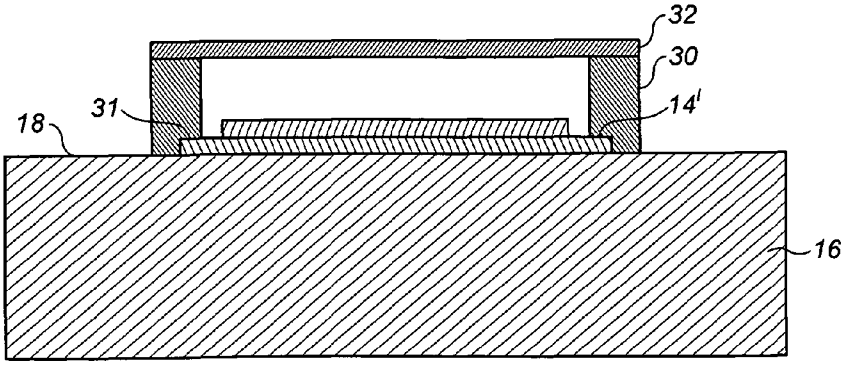
FIG. 14 illustrates a preferred mounting arrangement, in which the outer edge of the substrate is secured to a base layer by a support ring.

In view of these characteristics, combining the first and second of these three concepts leads to the a first construction illustrated in FIG. 14 (a "quasi built-in" support). The substrate 14 is built into a support ring 30, whereby the peripheral edge 14' of the substrate 14 is clamped and/or glued between an inward facing annular groove or recess 31 of the support ring 30 and the upper surface of the membrane 18. A cover layer 32, essentially comprising a planar disc, overlies the top of the support ring 30, e.g. by gluing, to protect the piezo-electric element 12 and the substrate 14 within the support ring 30. The design of the support ring 30 is chosen so as to provide sufficient inertia to resist movement at the periphery of the transducer 10. The amount of inertia is delivered by use of a dense material (steel) and sufficient thickness and width.

Figure 15:
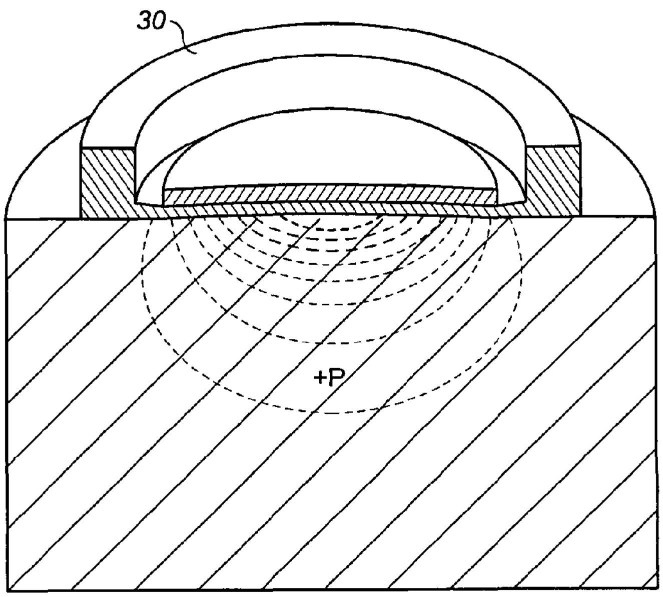
FIG. 15 is a cut-away view of an axi-symmetric finite element model simulation of the mounting arrangement of FIG. 14 showing the pressure field, with the transducer displaced slightly according to its vibration profile.
Figure 16:
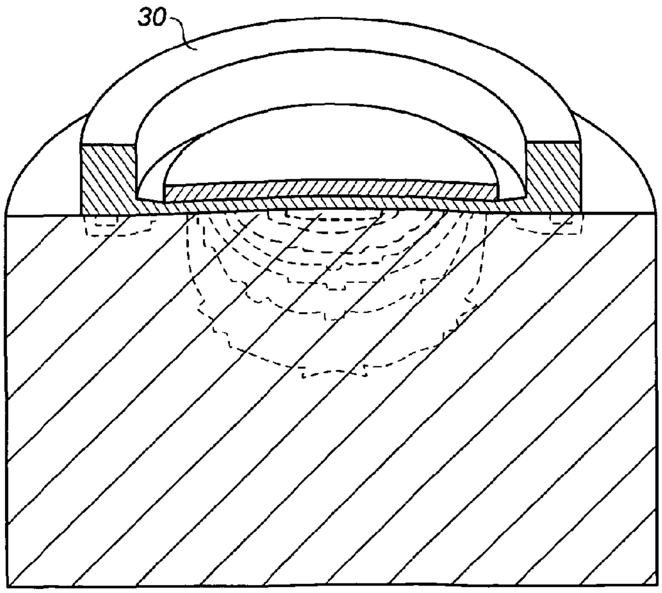
FIG. 16 corresponds to FIG. 15, but showing the velocity field.

Modelling simulation results for the construction of FIG. 14, having the support ring 30, are presented in FIGS. 15 and 16. These may be compared directly with the results of FIGS. 9 and 10. In these simulations, the value of L may be calculated as roughly 3.1 mm, and the effective depth of penetration is around 2.4 mm.

Figure 17:
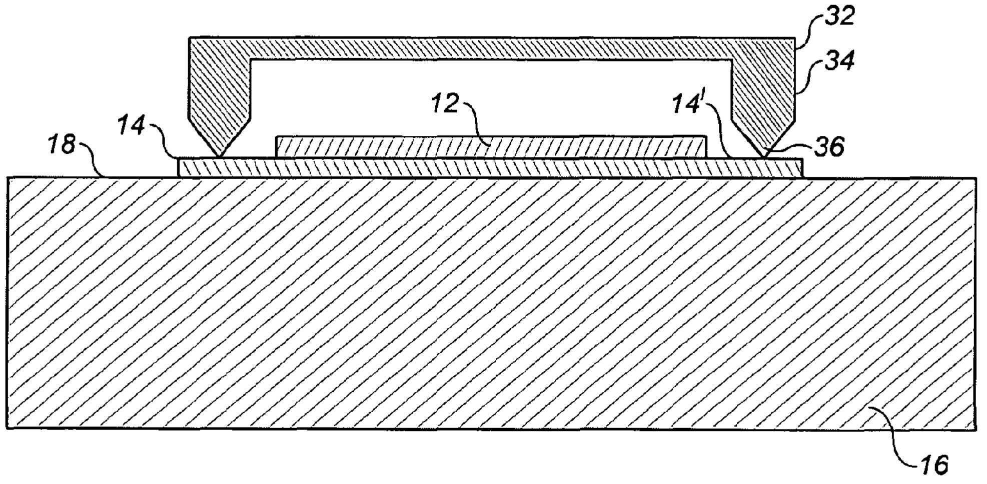
FIG. 17 illustrates a yet further alternative mounting arrangement, in which the outer edge of the substrate is supported by a pin-type joint.

An alternative example construction, which comprises a "quasi pin joint" like support, is illustrated in FIG. 17. The peripheral edge 14' of the substrate 14 is clamped between a pointed bottom surface 36 of a support ring 34 and the upper surface of the membrane 18. Glue may be added around the interface between the pointed bottom surface 36 and the peripheral edge 14' to seal the arrangement. A cover layer 32 overlies the top of the support ring 34, as with the arrangement of FIG. 14.

Figure 18:
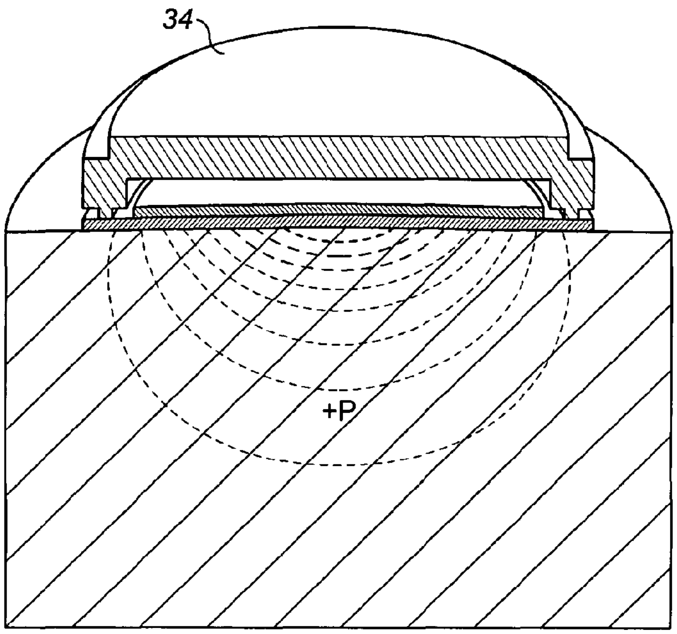
FIG. 18 is a cut-away view of an axi-symmetric finite element model simulation of the mounting arrangement of FIG. 17 showing the pressure field, with the transducer displaced slightly according to its vibration profile.
Figure 19:
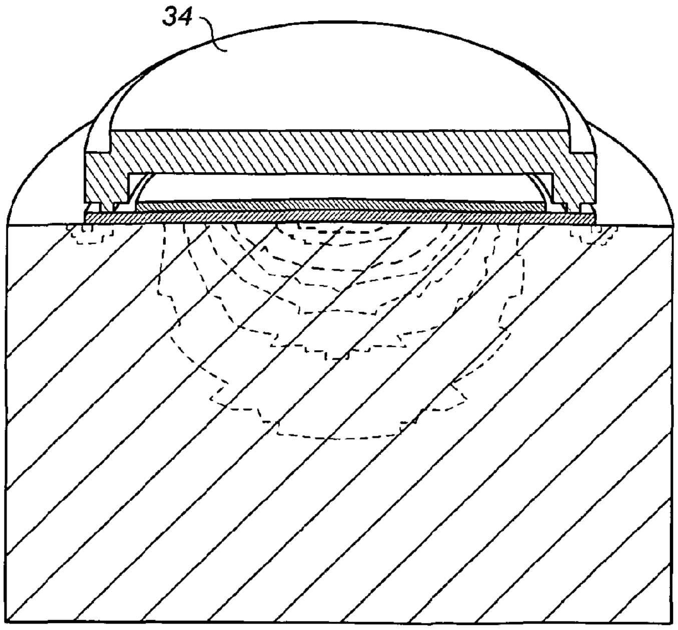
FIG. 19 corresponds to FIG. 18, but showing the velocity field.

Modelling simulation results of a physically representative system for the construction of FIG. 17, having the support ring 34, are presented in FIGS. 18 and 19. These may be compared directly with the results of FIGS. 9 and 10 and those of FIGS. 15 and 16. In these simulations, the value of L may be calculated as roughly 3.8 mm, and the effective depth of penetration is around 3.2 mm.

In each of the above simulations, the piezo-electric element 12 was modelled as comprising PZT: type 5, roughly 0.3 mm thick, and with diameter in the region of 6 mm; and the substrate 14 was modelled as ordinary stainless steel, roughly 0.3 mm thick, and with a diameter in the region of 8 mm.

Evidently, the method of mounting the transducer 10 is important as it determines the bending mode shape and affects the resonant frequencies. An effective mode shape is required in order to achieve a sufficiently deep and intense penetration of the pressure waves into the acoustic medium 16 at the low frequency mode.

Alternative Construction

In an alternative construction, the base layer or membrane 18 can be omitted from the design, with the substrate being applied directly to the skin (perhaps via a gel pad or other intermediary such as a free liquid medium). Further alternatively, instead of the various transducer assemblies of an array being mounted on an upper surface of the base layer 18, the base layer 18 could be applied on top of the array, an underside of the base layer being secured to the cover layer 32 of each assembly.

Further, the base layer 18 could comprise a dielectric layer to insulate the acoustic medium 16 from the transducer assembly.

Figure 21:
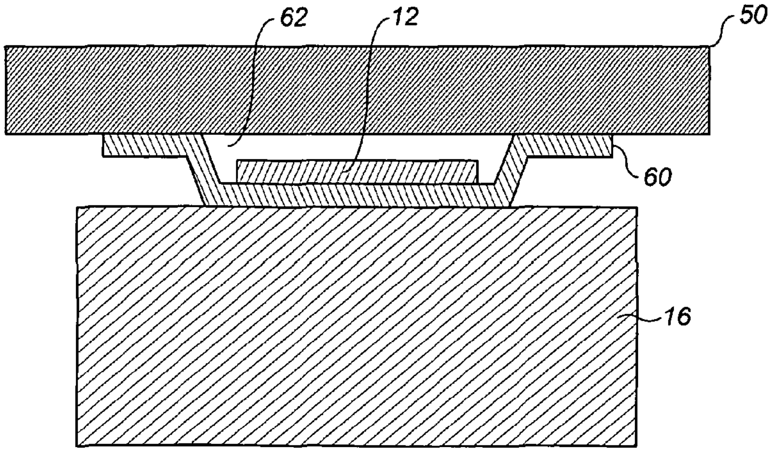
FIG. 21 illustrates, in cross-section, an even further alternative mounting arrangement.

Another alternative implementation involves the shaping or forming of the substrate to form a stiffening structure 60 including a recess 62 and then gluing the piezo-electric element 12 into the recess in the substrate. See FIG. 21.

The potential advantage of this alternative construction is that the metal ring (e.g. 30; 34; 52) is no longer required. Thus, a component and an associated assembly operation are eliminated, which would reduce the cost of the final product. A conformal coating (e.g. parylene) could be used on the formed underside of the substrate 60 in order to provide electrical insulation if required, such as where a voltage is applied through a shielding layer. Alternatively, the substrate may be used as a ground electrode for the piezo in which case electrical insulation is not required. As will be appreciated by those skilled in the art, a number of alternative ways could be used to attach this alternative transducer design to a patch or substrate, and there are a number of ways that electrical connections could be made to the piezoelectric element 12 and the metal substrate 60.

Mode of Use

A treatment patch is applied to skin, with the possible intermediary of a gel pad, which may contain a composition, as described in WO2006/040597, the contents of which are incorporated by reference herein. The transducer elements in the patch are selectively driven, via the address wires 56, 58, at low and high voltages in order to resonate, respectively, at the low frequency resonance bending mode and the high frequency resonance thickness mode.

The individual transducers in the array may be driven simultaneously. Each may be driven at the same frequency or selected transducers may be driven at, say, the low frequency whilst other transducers are driven at the high frequency. Alternatively or additionally, the transducers may be addressed in patterns, such as by rows in sequence, or in concentric waves, or other suitable patterns that ensure a desired relative level of exposure of the underlying skin to both frequencies, with no over or under exposure.

Whereas the piezo-electric element 12 and the substrate 14 have each been described as planar discs, it will be understood that other forms are possible.

Moreover, the skilled person would readily be able to combine aspects from several of the above described embodiments and examples. For example, it would be possible to implement the alternative recessed substrate design with any shape of piezo-electric element 12, by suitable alteration of the shape of the recess.

The invention claimed is:

1. A dual-frequency ultrasound transducer, comprising:

a substrate;

a single piezo-electric element bonded to the substrate, wherein the diameter of the substrate is greater than the diameter of the piezo-electric element;

wherein the transducer has a low frequency mechanical bending resonance mode when the piezo-electric element is excited, in use, by a voltage which includes a low frequency oscillating component in the range of 20 kHz to 500 kHz;

wherein the transducer has a high frequency thickness resonance mode when the piezo-electric element is excited, in use, by a voltage which includes a high frequency oscillating component in the range of 500 kHz to 5 MHz; and wherein a combined thickness of the substrate and the piezo-electric element is determined on the basis of a desired high resonant frequency in the range of 500 kHz to 5 MHz, and wherein the diameters of the piezo-electric element and the substrate are determined on the basis of the combined thickness and a desired low resonant frequency in the range of 20 kHz to 500 kHz.

2. The transducer of claim 1, wherein the piezo-electric element is recessed in from the edge of the substrate.

3. The transducer of claim 1, wherein the piezo-electric element is a planar disc.

4. The transducer of claim 3, wherein the substrate is a planar disc.

5. The transducer of claim 1, further comprising a base layer on which the substrate is supported, the outer edge of the substrate being bent away and out of contact from the base layer.

6. The transducer of claim 1, further comprising a base layer and a support structure, wherein the peripheral edge of the substrate is clamped between the support structure and the base layer.

7. The transducer of claim 6, wherein the support structure includes an inward facing recess into which the peripheral edge of the substrate is received so as to restrict displacement and rotation of the substrate at said peripheral edge.

8. The transducer of claim 6, wherein the support structure includes a pointed bottom surface that constrains displacement of the substrate and allows rotation of the substrate and wherein the transducer's first and only nodal diameter is at the outer edge of the transducer.

9. The transducer of claim 1, wherein the substrate is profiled to form a recess in which the peizo-electric element is received.

10. The transducer of claim 1, wherein the substrate is metal.

11. A patch comprising a plurality of the transducers of claim 1 arranged in an array.

12. The transducer of claim 1, wherein the diameters are at least 5 times the combined thickness of the substrate and the piezo-element.

13. The transducer of claim 1, wherein the substrate is made of a material selected to maximize performance of the transducer at the desired low resonant frequency.

14. The transducer of claim 1, wherein the substrate and the piezo-electric element are each made of a material and a thickness according to the equation:

$$Y_1 h_1^2 = Y_2 h_2^2,$$

where $Y_1$ is a stiffness of the peizo-electric element, $Y_2$ is a stiffness of the substrate, $h_1$ is the thickness of the peizo-electric element and $h_2$ is the thickness of the substrate.

15. A system comprising the patch of claim 11 and a gel pad configured to be disposed between the patch and skin under treatment.

16. The system of claim 15, wherein the piezo-electric element is recessed in from the edge of the substrate.

17. The system of claim 15, wherein the piezo-electric element is a planar disc.

18. The system of claim 17, wherein the substrate is a planar disc.

19. The system of claim 15, wherein each of the transducers in the array further comprises a base layer on which the substrate is supported, the outer edge of the substrate being bent away and out of contact from the base layer.

20. The system of claim 15, wherein each of the transducers in the array further comprises a base layer and a support structure, wherein the peripheral edge of the substrate is clamped between the support structure and the base layer.

21. The system of claim 20, wherein the support structure includes an inward facing recess into which the peripheral edge of the substrate is received so as to restrict displacement and rotation of the substrate at said peripheral edge.

22. The system of claim 20, wherein the support structure includes a pointed bottom surface that constrains displacement of the substrate and allows rotation of the substrate and wherein the transducer's first and only nodal diameter is at the outer edge of the transducer.

23. The system of claim 15, wherein the substrate is profiled to form a recess in which the peizo-electric element is received.

24. The system of claim 15, wherein the substrate is metal.

* * * * *